(12) United States Patent
Chen

(10) Patent No.: US 9,007,097 B2
(45) Date of Patent: Apr. 14, 2015

(54) KEY PRESS DETECTING CIRCUIT AND METHOD FOR DETECTING THE STATUS OF MULTIPLE KEYS THROUGH A SINGLE PIN

(71) Applicant: Pixart Imaging Inc., Hsin-Chu (TW)

(72) Inventor: Yung-Hung Chen, Hsin-Chu (TW)

(73) Assignee: Pixart Imaging Inc., Hsin-Chu (TW)

( * ) Notice: Subject to any disclaimer, the term of this patent is extended or adjusted under 35 U.S.C. 154(b) by 0 days.

(21) Appl. No.: 13/889,474

(22) Filed: May 8, 2013

(65) Prior Publication Data

US 2013/0300459 A1 Nov. 14, 2013

(30) Foreign Application Priority Data

May 10, 2012 (TW) .............................. 101116725 A

(51) Int. Cl.
*H03K 5/153* (2006.01)
*H01H 9/54* (2006.01)
*H03K 5/1254* (2006.01)

(52) U.S. Cl.
CPC ............... *H01H 9/54* (2013.01); *H03K 5/1254* (2013.01)

(58) Field of Classification Search
CPC ...... G01R 19/1659; G01R 23/15; H03K 5/08; H03K 5/24; H03K 5/2481; H03K 5/249; G01S 1/02; G05B 1/02

USPC .......... 327/198, 74, 103, 417, 18, 21, 50, 77; 341/22, 101, 155

See application file for complete search history.

(56) References Cited

U.S. PATENT DOCUMENTS

| | | | |
|---|---|---|---|
| 6,075,390 A * | 6/2000 | Shin et al. ...................... | 327/74 |
| 7,109,899 B2 * | 9/2006 | Huang et al. ................... | 341/101 |
| 7,215,274 B2 * | 5/2007 | Liu ................................ | 341/156 |
| 7,427,936 B2 * | 9/2008 | Takeuchi ....................... | 341/120 |
| 8,193,834 B2 * | 6/2012 | Maher et al. ................... | 327/50 |
| 2005/0184900 A1 * | 8/2005 | Chu ............................... | 341/155 |
| 2008/0024326 A1 * | 1/2008 | DiFatta et al. .................. | 341/22 |

* cited by examiner

*Primary Examiner* — Lincoln Donovan
*Assistant Examiner* — Thomas Skibinski
(74) *Attorney, Agent, or Firm* — Muncy, Geissler, Olds & Lowe, P.C.

(57) ABSTRACT

A key press detecting circuit and method detect the status of multiple keys through a single pin. In an embodiment, a constant current is provided to apply to a key module through a single pin, to generate a voltage at the single pin that is related to the equivalent resistance of the key module observed from the single pin, and the voltage of the single pin is compared with a set of reference values to identify the status of the plurality of keys. In another embodiment, a variable current is provided to apply to a key module through a single pin in such a way that the variable current is adjusted to maintain a constant voltage at the single pin, and the variable current is compared with a set of reference values to identify the status of the plurality of keys.

8 Claims, 3 Drawing Sheets

KEY PRESS DETECTING CIRCUIT AND METHOD FOR DETECTING THE STATUS OF MULTIPLE KEYS THROUGH A SINGLE PIN

FIELD OF THE INVENTION

The present invention is related generally to a key press detecting circuit and method. More particularly, the present invention is related to a key press detecting circuit and method for detecting the status of multiple keys through a single pin.

BACKGROUND OF THE INVENTION

As shown in FIG. 1, to detect the status of multiple keys B1, B2 and B3, a conventional key detector chip 10 needs the same number of pins P1, P2 and P3 as the number of the keys B1, B2 and B3, to be connected to the key circuits 12, 14 and 16, respectively, where the keys B1, B2 and B3 are provided, and each of the key circuits 12, 14 and 16 has a single key B1, B2 or B3 connected in series (as the key circuit 16) or in parallel (as the key circuits 12 and 14) with a resistor R1, R2 or R3. When any of the keys B1, B2 and B3 is pressed, the equivalent resistance of the corresponding key circuit 12, 14 or 16 observed from the pins P1, P2 or P3 changes. In the back-end of each of the pins P1, P2 and P3 is provided an individual key press detecting circuit 18, 20 or 22 for detecting whether the corresponding key B1, B2 or B3 is pressed. Since each key needs a pin and a key press detecting circuit for implementing the key press detecting function, the costs and the size of a conventional key detector chip both are increased in the applications where more keys are used.

SUMMARY OF THE INVENTION

An objective of the present invention is to provide a key press detecting circuit and method for detecting the status of multiple keys through a single pin.

Another objective of the present invention is to provide an input device using a single pin for detecting the status of multiple keys.

According to the present invention, a constant current is provided to apply to a key module through a single pin, to generate a voltage at the single pin that is related to the equivalent resistance of the key module observed from the single pin, and the voltage of the single pin is compared with a set of reference values to identify the status of the plurality of keys.

According to the present invention, a variable current is provided to apply to a key module through a single pin in such a way that the variable current is adjusted to maintain a constant voltage at the single pin, and the variable current is compared with a set of reference values to identify the status of the plurality of keys.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
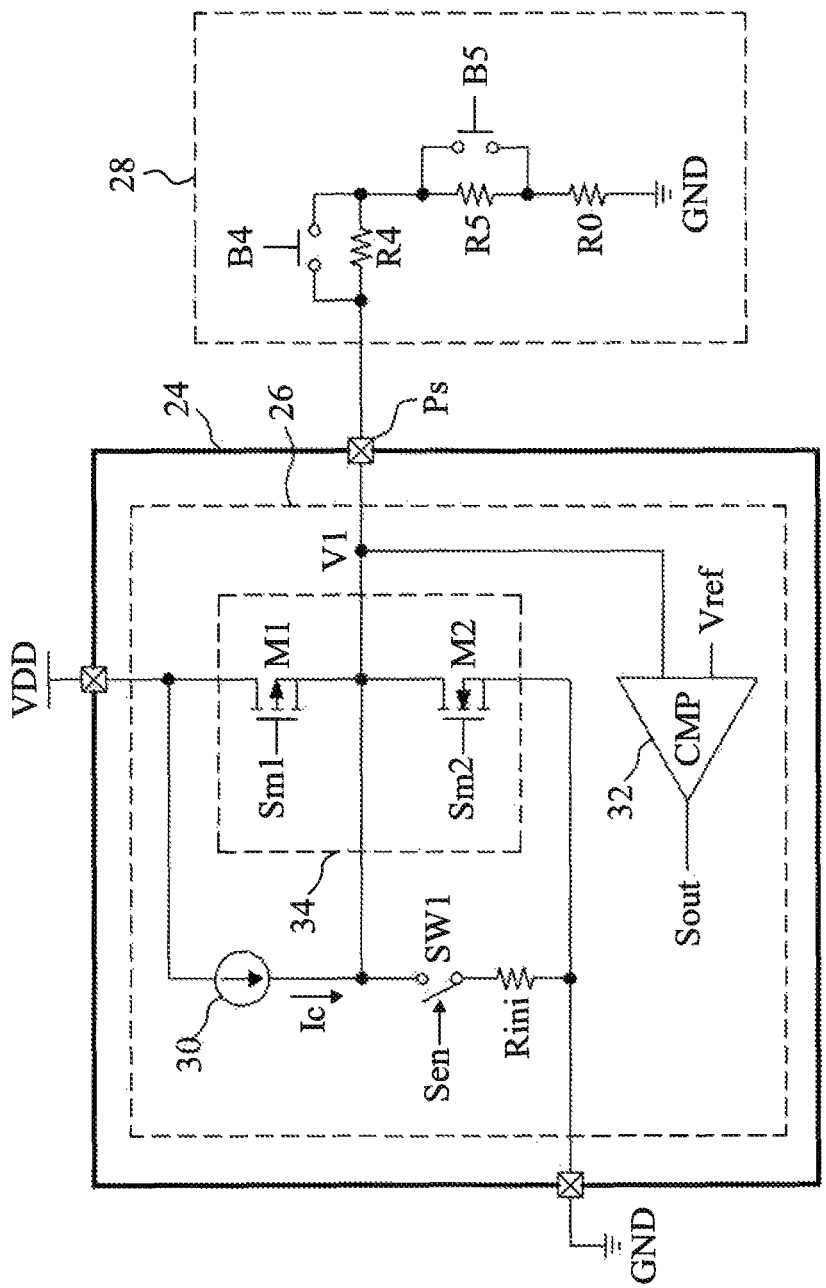
FIG. 2 is a circuit diagram of a first embodiment according to the present invention.

FIG. 2 is a circuit diagram of a first embodiment according to the present invention, in which a key press detecting circuit 26 inside of a key detector chip 24 and a key module 28 external to the key detector chip 24 are connected to each other through a single pin Ps to establish an input device, and the key press detecting circuit 26 detects the status of multiple keys in the key module 28 through the single pin Ps.

To illustrate the operation of the key press detecting circuit 26 shown in FIG. 2, it is assumed in this embodiment that the key module 28 includes resistors R4, R5 and R0 connected in series between the single pin Ps and a ground terminal GND, a key B4 is connected in parallel to the resistor R4, a key B5 is connected in parallel to the resistor R5, and the corresponding resistances have the relationship $$R4 = R0 = \frac{1}{2}R5.$$

Therefore, the equivalent resistance of the key module 28 observed from the single pin Ps varies with how the keys B4 and B5 are pressed. In further details, when neither of the keys B4 and B5 is pressed, the equivalent resistance of the key module 28 is equal to $R4+R5+R0=4 \times R0$; when only the key B4 is pressed, the equivalent resistance of the key module 28 is equal to $R5+R0=3 \times R0$; when only the key B5 is pressed, the equivalent resistance of the key module 28 is equal to $R4+R0=2 \times R0$; and when both the keys B4 and B5 are pressed, the equivalent resistance of the key module 28 is equal to R0.

In this embodiment, the key press detecting circuit 26 includes a current source 30 connected to the single pin Ps, for providing a constant current Ic to apply to the key module 28 through the single pin Ps, and thus the voltage V1 of the single pin Ps is equal to the multiplication of the constant current Ic and the equivalent resistance of the key module 28 observed from the single pin Ps, $V1=Ic \times R(28)$. Since the current Ic is constant, and the equivalent resistance of the key module 28 varies with how the keys B4 and B5 are pressed, it can detect the status of the keys B4 and B5 from the voltage V1 of the single pin Ps. The key press detecting circuit 26 further includes a voltage comparator 32 connected to the single pin Ps to compare the voltage V1 of the single pin Ps with a set of reference values Vref to generate an output signal Sout representative of the status of the keys B4 and B5.

Preferably, the key press detecting circuit 26 further includes a charging/discharging circuit 34 connected to the single pin Ps, for pre-charging or pre-discharging the single pin Ps to quickly stabilize the voltage V1 of the single pin Ps, and thereby speed up the response of the key press detecting circuit 26. In this embodiment, the charging/discharging circuit 34 includes a high-side transistor M1 connected between a voltage source VDD and the single pin Ps, and a low-side transistor M2 connected between the single pin Ps and a ground terminal GND. The transistors M1 and M2 act as switches and are controlled by control signals Sm1 and Sm2, respectively. When the transistor M1 is on, the voltage source VDD charges the single pin Ps through the transistor M1; and when the transistor M2 is on, the single pin Ps discharges to the ground terminal GND through the transistor M2. In other embodiments, the charging/discharging circuit 34 contains only one of the high-side transistor M1 and the low-side transistor M2, depending on pre-charging or pre-discharging demand.

Figure 1:
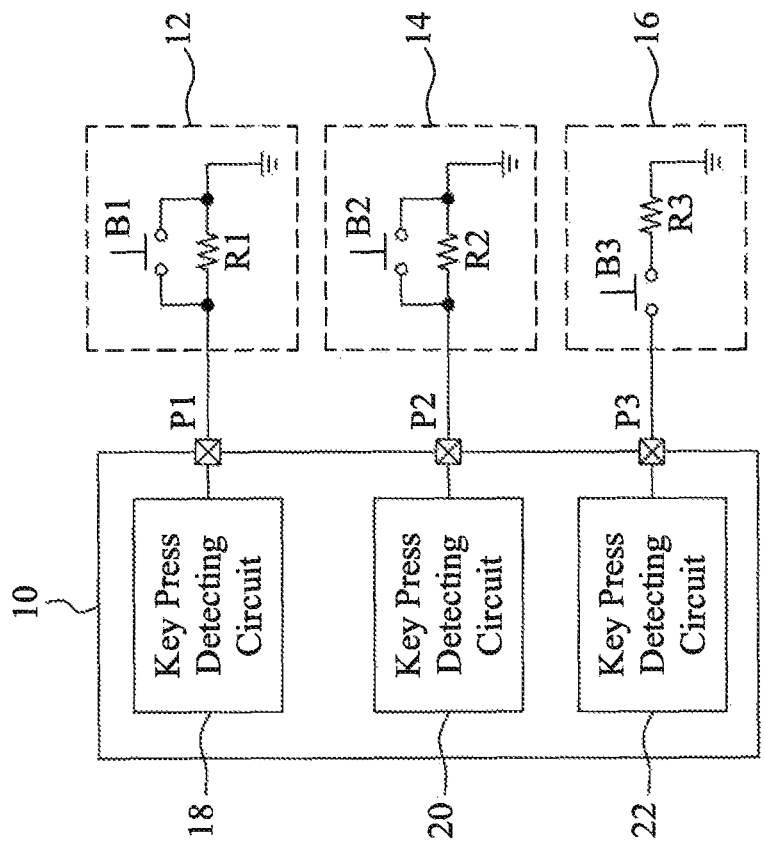
FIG. 1 shows a conventional key detector chip for detecting the status of multiple keys.

In various applications of the key detector chip 24, an external key module may cause the single pin Ps to become floating. For example, as shown in FIG. 1, when the key B3 in the key circuit 16 is not pressed, the pin P3 becomes floating, causing the voltage of the pin P3 to fluctuate. For preventing this, the key press detecting circuit 26 shown in FIG. 2 further includes an initializing resistor Rini or a switch SW1 or both of them connected between the single pin Ps and the ground terminal GND, for initializing the voltage V1 of the single pin Ps, thereby preventing it from fluctuating. Preferably, the key press detecting circuit 26 has an initializing resistor Rini and a switch SW1 connected in series between the single pin Ps and the ground terminal GND, for initializing the voltage V1 of the single pin Ps when the switch SW1 is turned on. When using the key detector chip 24, a user may determine whether the voltage of the single pin Ps will be fluctuating according to the key module 28, and then determine whether to use an enable signal Sen to initialize the voltage V1 of the single pin Ps accordingly. Alternatively, in other embodiments, an initializing resistor Rini or a switch SW1 or serially connected initializing resistor Rini and switch SW1 is connected between the single pin Ps and a voltage source, e.g. VDD, instead of between the single pin Ps and the ground terminal GND.

Figure 3:
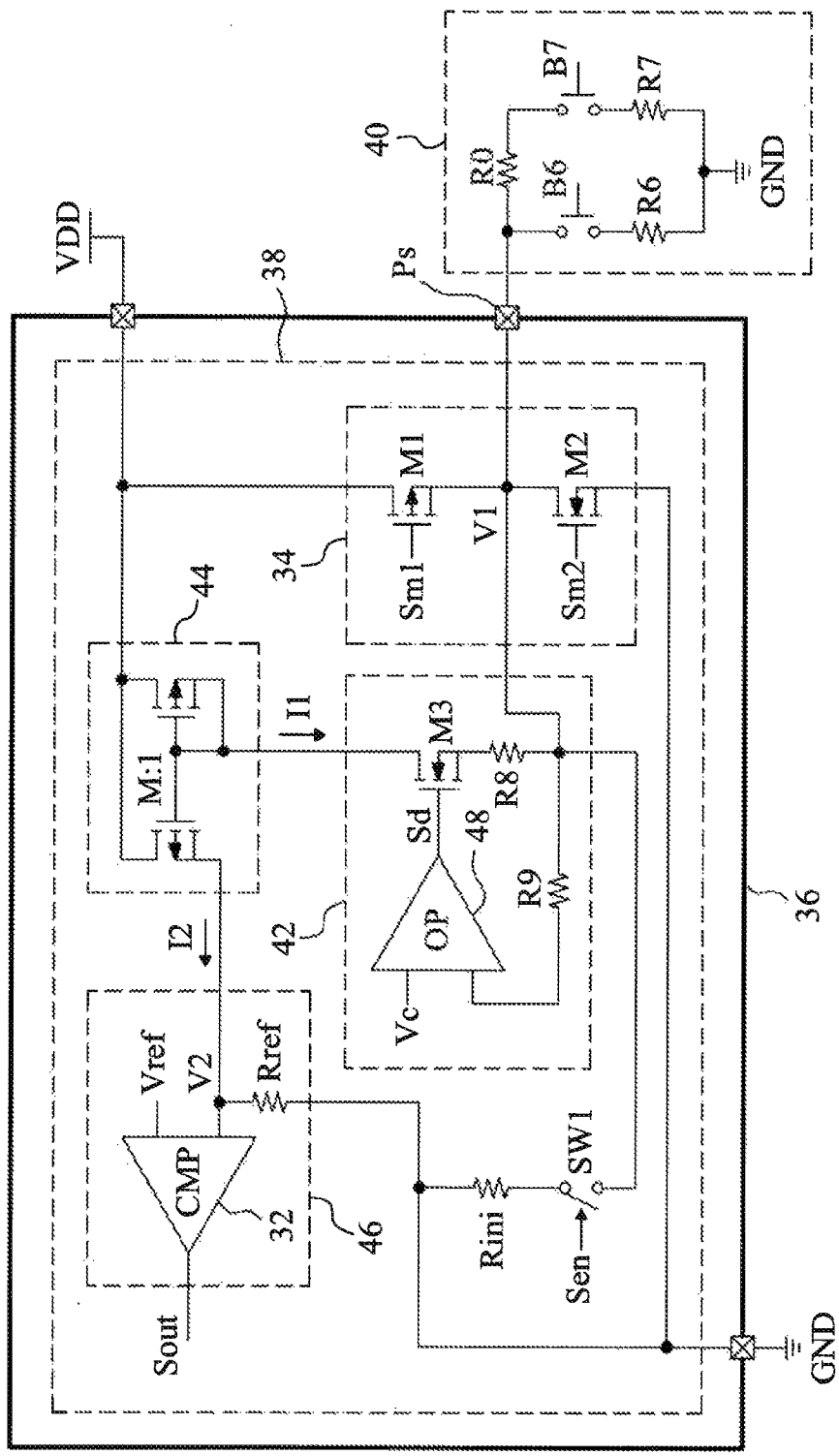
FIG. 3 is a circuit diagram of a second embodiment according to the present invention.

FIG. 3 is a circuit diagram of a second embodiment according to the present invention, in which a key press detecting circuit 38 inside of a key detector chip 36 and a key module 40 external to the key detector chip 36 are connected to each other through a single pin Ps to establish an input device, and the key press detecting circuit 38 detects the status of multiple keys in the key module 40 through the single pin Ps.

To illustrate the operation of the key press detecting circuit 38 shown in FIG. 3, it is assumed in this embodiment that the key module 40 includes a key B6 and a resistor R6 connected in series between the single pin Ps and a ground terminal GND, and a key B7 and two resistors R7 and R0 connected in series between the single pin Ps and the ground terminal GND, while the resistor R0 is connected between the single pin Ps and the key B7, and the corresponding resistances have the relationship R6=R7=R0. Therefore, the equivalent resistance of the key module 40 observed from the single pin Ps varies with how the keys B6 and B7 are pressed. In further details, when only the key B6 is pressed, the equivalent resistance of the key module 40 is equal to R6=R0; when only the key B7 is pressed, the equivalent resistance of the key module 40 is equal to R7+R0=2×R0; when both the keys B6 and B7 are pressed, the equivalent resistance of the key module 40 is equal to $$\frac{2}{3}R0,$$

and when neither of the keys B6 and B7 is pressed, the single pin Ps becomes floating. As explained above in the description of the embodiment shown in FIG. 2, by connecting an initializing resistor Rini or a switch SW1 or both of them between the single pin Ps and a ground terminal GND or a voltage source, fluctuation of the voltage V1 of the single pin Ps can be prevented. Alternatively, in other embodiments, the initializing resistor Rini may be arranged outside the key detector chip 36, for example, in the key module 40 or using an external resistor connected to the single pin Ps.

In this embodiment, the key press detecting circuit 38 includes a constant voltage control circuit 42 connected to the single pin Ps, and a current source 44 for providing a variable current I1 to apply to the single pin Ps through the constant voltage control circuit 42. The constant voltage control circuit 42 maintains the voltage V1 of the single pin Ps at a reference value Vc, and thus variation of the equivalent resistance of the key module 40 will cause the variable current I1 to change as I1=Vc/R(40). In other words, the equivalent resistance of the key module 40 reflects the status of the keys B6 and B7, and the variable current I1 reflects the equivalent resistance of the key module 40. For detecting the variable current I1, the current source 44 includes a current mirror for mirroring the variable current I1 to generate a mirror current I2, and the mirror current I2 is compared with a set of reference values by a current comparator 46 to generate an output signal Sout representative of the status of the keys B6 and B7.

In this embodiment, the current comparator 46 includes a reference resistor Rref connected between the current source 44 and a ground terminal GND for converting the mirror current I2 into a voltage V2=I2×Rref, and a voltage comparator 32 for comparing the voltage V2 with the set of reference values Vref to generate the output signal Sout.

In this embodiment, the constant voltage control circuit 42 has a transistor M3 and a resistor R8 connected in series between the current source 44 and the single pin Ps, and an operational amplifier 48 for controlling the transistor M3 to thereby adjust the variable current I1. The operational amplifier 48 has a first input terminal receiving the reference voltage Vc, a second input terminal connected to the single pin Ps, and an output terminal providing an error signal Sd to a gate of the transistor M3. Such a circuit can maintain the voltage V1 of the single pin Ps at the reference value Vc. When the equivalent resistance of the key module 40 varies, due to the virtual short circuit between the two input terminals of the operational amplifier 48, the error signal Sd will change and thus control the transistor M3 to adjust the variable current I1 in order to maintain the voltage V1 of the single pin Ps at the reference value Vc. The change of the variable current I1 is reflected to the mirror current I2, and in turn reflected to the output signal Sout. Preferably, the constant voltage control circuit 42 further includes a resistor R9 connected between the input terminal of the operational amplifier 48 and the single pin Ps.

The same as the embodiment shown in FIG. 2, the key press detecting circuit 38 in this embodiment may further include a charging/discharging circuit 34 connected to the single pin Ps, for pre-charging or pre-discharging the single pin Ps to quickly stabilize the voltage V1 of the single pin Ps, and thereby speed up the response of the key press detecting circuit 38. Likewise, the key press detecting circuit 38 in this embodiment may further include an initializing resistor Rini or a switch SW1 or both of them connected between the single pin Ps and the ground terminal GND, for initializing the voltage V1 of the single pin Ps, thereby preventing it from fluctuating. The operations of the charging/discharging circuit 34, the initializing resistor Rini and the switch SW1 are the same as that described for the embodiment shown in FIG. 2.

As demonstrated in the above embodiments, the present invention needs only a single pin to detect the status of multiple keys, and the multiple keys can have any arrangement with resistors to establish a key module, provided that how they are pressed can change the equivalent resistance of the key module. In applications where more keys are used, the present invention has the advantage of saving many pins in the key detector chip, thereby significantly reducing the costs for packaging. Also, as the present invention needs only a key press detecting circuit with multiple reference values, area of the key detector chip can be minimized.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A key press detecting circuit for detecting a status of a plurality of keys through a single pin, the plurality of keys being connected in series or in parallel with a plurality of resistors to establish a key module connected to the single pin, the key press detecting circuit comprising:
   a constant current source connected to the single pin, providing a constant current applied to the key module through the single pin, to thereby generate a voltage related to an equivalent resistance of the key module at the single pin;
   a voltage comparator connected to the single pin, comparing the voltage of the single pin with a set of reference values to generate an output signal representative of the status of the plurality of keys; and
   a charging/discharging circuit connected to the single pin, being controlled to pre-charge or pre-discharge the single pin.

2. The key press detecting circuit of claim 1, wherein the charging/discharging circuit comprises a transistor connected between a voltage source and the single pin, or between the single pin and a ground terminal.

3. The key press detecting circuit of claim 1, further comprising an initializing resistor, a switch, or a serially-connected combination thereof, connected between the single pin and a ground terminal or a voltage source, being controlled to initialize the voltage of the single pin.

4. A key press detecting method for detecting a status of a plurality of keys through a single pin, the plurality of keys being connected in series or in parallel with a plurality of resistors to establish a key module connected to the single pin, the key press detecting method comprising the steps of:
   applying a constant current to the key module through the single pin, for generating a voltage related to an equivalent resistance of the key module at the single pin;
   comparing the voltage of the single pin with a set of reference values, for generating an output signal representative of the status of the plurality of keys; and
   pre-charging or pre-discharging the single pin, for speeding up response of detecting the status of the plurality of keys.

5. The key press detecting method of claim 4, further comprising the step of initializing the voltage of the single pin.

6. An input device comprising:
   a plurality of keys and a plurality of resistors configured to establish a key module connected to a single pin, the key module having an equivalent resistance dependent on the status of the plurality of keys;
   a constant current source connected to the single pin, providing a constant current applied to the key module through the single pin, to thereby generate a voltage related to an equivalent resistance of the key module at the single pin;
   a voltage comparator connected to the single pin, comparing the voltage of the single pin with a set of reference values to generate an output signal representative of the status of the plurality of keys; and
   a charging/discharging circuit connected to the single pin, being controlled to pre-charge or pre-discharge the single pin.

7. The input device of claim 6, wherein the charging/discharging circuit comprises a transistor connected between a voltage source and the single pin, or between the single pin and a ground terminal.

8. The input device of claim 6, further comprising an initializing resistor, a switch, or a serially-connected combination thereof, connected between the single pin and a ground terminal or a voltage source, being controlled to initialize the voltage of the single pin.

\* \* \* \* \*